United States Patent
Ohashi et al.

(10) Patent No.: US 12,028,986 B2
(45) Date of Patent: Jul. 2, 2024

(54) MOUNTING METHOD AND MOUNTING STRUCTURE FORMED BY THE SAME

(71) Applicant: Panasonic Intellectual Property Management Co., Ltd., Osaka (JP)

(72) Inventors: Naomichi Ohashi, Hyogo (JP); Yasuhiro Okawa, Osaka (JP); Koso Matsuno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 214 days.

(21) Appl. No.: 17/367,269

(22) Filed: Jul. 2, 2021

(65) Prior Publication Data

US 2022/0030721 A1 Jan. 27, 2022

(30) Foreign Application Priority Data

Jul. 27, 2020 (JP) ................................ 2020-126689

(51) Int. Cl.
| | |
|---|---|
| *B23K 1/00* | (2006.01) |
| *H05K 1/03* | (2006.01) |
| *H05K 1/09* | (2006.01) |
| *H05K 3/34* | (2006.01) |
| *B23K 101/40* | (2006.01) |
| *B23K 103/00* | (2006.01) |

(52) U.S. Cl.
CPC ........... *H05K 3/341* (2013.01); *B23K 1/0016* (2013.01); *H05K 1/032* (2013.01); *H05K 1/092* (2013.01); *B23K 2101/40* (2018.08); *B23K 2103/42* (2018.08)

(58) Field of Classification Search
None
See application file for complete search history.

(56) References Cited

U.S. PATENT DOCUMENTS

| | | |
|---|---|---|
| 5,461,775 A | 10/1995 | Tanabe et al. |
| 5,569,886 A | 10/1996 | Tanabe et al. |

(Continued)

FOREIGN PATENT DOCUMENTS

| | | | |
|---|---|---|---|
| CN | 101014442 A | * 8/2007 | ........... B23K 35/025 |
| JP | 6-310839 | 11/1994 | |

(Continued)

*Primary Examiner* — Devang R Patel
(74) *Attorney, Agent, or Firm* — Wenderoth, Lind & Ponack, L.L.P.

(57) ABSTRACT

A method for mounting an electronic component on a resin base material, the method including:
(1) preparing the resin base material having a wiring pattern formed of a conductive paste;
(2) supplying a solder paste which contains solder particles and a thermosetting resin in a state before curing to a predetermined portion of the resin base material;
(3) placing the electronic component on the solder paste; and
(4) heating the resin base material to heat the solder paste to a temperature in a range from 105° C. to 130° C., inclusive to melt the solder particles, and starting a curing exothermic reaction of the thermosetting resin, wherein
a melting temperature of the solder particles is in a range from 90° C. to 130° C., inclusive, and a peak temperature of the curing exothermic reaction of the thermosetting resin is in a range from 135° C. to 165° C., inclusive.

6 Claims, 2 Drawing Sheets

(56) References Cited

U.S. PATENT DOCUMENTS

| | | | | |
|---|---|---|---|---|
| 7,713,787 B2* | 5/2010 | Kojima | ............... | H01L 23/4952 |
| | | | | 438/107 |
| 2014/0158751 A1* | 6/2014 | Motomura | .............. | H01L 24/81 |
| | | | | 228/248.1 |
| 2017/0188468 A1* | 6/2017 | Hino | ....................... | H01L 24/81 |
| 2018/0092211 A1* | 3/2018 | Minegishi | .......... | B23K 35/0244 |
| 2018/0229333 A1* | 8/2018 | Hino | ....................... | C08L 63/10 |
| 2019/0232438 A1* | 8/2019 | Hino | ................... | B23K 35/025 |

FOREIGN PATENT DOCUMENTS

| | | |
|---|---|---|
| JP | 8-153948 | 6/1996 |
| JP | 9-167890 | 6/1997 |
| JP | 2007-300038 | 11/2007 |
| JP | 2010-077265 | 4/2010 |
| JP | 2019-141878 | 8/2019 |

* cited by examiner

(Table 1)

|  | Melting temperature of solder particles | Peak temperature of curing exothermic reaction of epoxy resin | Heating temperature | Heating time | Thermosetting resin portion occupied area ratio | Determination |
|---|---|---|---|---|---|---|
| Example 1 | 98°C | 143°C | 130°C | 10 minutes | 28% | Appropriate |
| Example 2 | 98°C | 143°C | 120°C | 10 minutes | 18% | Appropriate |
| Example 3 | 98°C | 155°C | 120°C | 10 minutes | 20% | Appropriate |
| Example 4 | 98°C | 143°C | 120°C | 20 minutes | 24% | Appropriate |
| Comparative example 1 | 98°C | 143°C | 140°C | 10 minutes | 42% | Appropriate |
| Comparative example 2 | 98°C | 120°C | 120°C | 10 minutes | 0% | Inappropriate |
| Comparative example 3 | 98°C | 120°C | 110°C | 10 minutes | 0% | Inappropriate |

MOUNTING METHOD AND MOUNTING STRUCTURE FORMED BY THE SAME

BACKGROUND

1. Technical Field

The present invention relates to a method for mounting an electronic component, specifically, a method for mounting an electronic component on a base material having a wiring or an electrode, and more specifically, a method for mounting an electronic component on a base material having a wiring or an electrode formed using a conductive paste by using a solder paste. In addition, the invention also relates to a mounting structure formed by such a method.

2. Description of the Related Art

In a field of electronics, research and development and practical use of a wearable electronic device which is used by integrating with clothes or by attaching the electronic device to a skin are advanced. Such a wearable device requires flexibility. In this case, there is an increasing need to use a flexible material as a base material for a printed circuit board, a wiring material, and the like used in the electronic device.

Examples in which a thermoplastic film such as PET, PEN, or PI, a stretchable urethane film, and the like are used as the flexible base material have been well reported, and in this case, when the wiring, the electrode, and the like are formed on the base material, a method of printing a conductive paste on the base material to form the wiring, the electrode, and the like is often used. The wiring, the electrode, and the like formed of the conductive paste can be formed by supplying the conductive paste to the base material by screen printing and then drying the conductive paste.

Solder is preferably used as a bonding material for electrically connecting the wiring, the electrode, and the like to the electronic component from a viewpoint of reliability. However, there is a problem that a resin component contained in the conductive paste inhibits wetting of the solder, and a conductive filler contained in the wiring, the electrode, and the like diffuses into the solder and disappears, which may result in a disconnection state. In order to solve this problem, for example, Japanese Patent Unexamined Publication No. H8-153948 discloses a measure of further forming a metal plating layer which easily forms an alloy with the solder on a surface of the wiring, the electrode, and the like formed of the conductive paste.

SUMMARY

In a first aspect of the invention, there is provided a method for mounting an electronic component on a resin base material, the method including:
(1) preparing the resin base material having a wiring pattern formed of a conductive paste;
(2) supplying a solder paste which contains solder particles and a thermosetting resin in a state before curing to a predetermined portion of the resin base material;
(3) placing the electronic component on the solder paste; and
(4) heating the resin base material to heat the solder paste to a temperature in a range from 105° C. to 130° C., inclusive to melt the solder particles, and starting a curing exothermic reaction of the thermosetting resin, wherein
a melting temperature of the solder particles is in a range from 90° C. to 130° C., inclusive, and a peak temperature of the curing exothermic reaction of the thermosetting resin is in a range from 135° C. to 165° C., inclusive.

In a second aspect of the invention, there is provided a mounting structure in which an electronic component is mounted on a resin base material, the mounting structure including:
the resin base material; a wiring pattern formed of a conductive paste on the resin base material; the electronic component disposed on the resin base material; and a solder bonding portion electrically connecting the wiring pattern to the electronic component, more specifically, the electrode thereof, in which
a cured thermosetting resin portion is interposed between the solder bonding portion and the resin base material.

DETAILED DESCRIPTION

As described in Japanese Patent Unexamined Publication No. H8-153948, when the wiring, the electrode, and the like formed of the conductive paste are bonded to the electronic component by the solder, the wiring, the electrode, and the like on the base material are firmly bonded to the electrode of the electronic component by metal bonding, but a bonding strength of an interface between the base material and the wiring, the electrode, and the like, or a strength of the wiring, the electrode, and the like itself is not necessarily sufficient, and therefore, a measure for reinforcing the bonding strength of the interface between the base material and the wiring, the electrode, and the like, or the strength of the wiring, the electrode, and the like itself is desired.

Therefore, an object of the invention is to provide a method of forming a mounting structure by using a resin base material, particularly a film-shaped resin base material (for example, a thermoplastic film such as PET, PEN, and PI, and a stretchable urethane film) and mounting an electronic component on a wiring, an electrode, and the like formed on the base material by a conductive paste, in which an extra step is not required for the above-described reinforcement of the bonding strength of the interface between the substrate and the wiring, the electrode, and the like. Further, another object of the invention is to provide a mounting structure in which the bonding strength of the interface between the base material and the wiring, the electrode, and the like is reinforced.

In a first aspect of the invention, there is provided a method for mounting the electronic component on the resin base material, the method including;
(1) preparing the resin base material having a wiring pattern formed of a conductive paste;
(2) supplying a solder paste which may contain solder particles and a thermosetting resin (in a state before curing) to a predetermined portion of the resin base material;
(3) placing the electronic component on the solder paste; and
(4) heating the base material to heat the solder paste to a temperature of 105° C. to 130° C. to melt the solder particles, and starting a curing exothermic reaction of the thermosetting resin, in which
the melting temperature of the solder particles is 90° C. to 130° C., and a peak temperature of the curing exothermic reaction of the thermosetting resin is 135° C. to 165° C.

In the method of forming the mounting structure as described above, when the solder particles contained in the solder paste are melted in the heating in the step (4), the curing exothermic reaction of the thermosetting resin is started, but a heating temperature is 105° C. to 130° C. and thus does not reach the peak temperature, so that the liquid thermosetting resin has sufficient fluidity. Thereafter, the curing of the thermosetting resin gradually proceeds. As a result, a solder bonding portion is formed between the wiring pattern and the electronic component, more specifically, between the wiring pattern and the electrode of the electronic component to ensure electrical connection therebetween, and the sufficiently cured thermosetting resin portion is formed (thereafter) to be interposed between the base material and the solder bonding portion. Thereafter, the base material is cooled to solidify the solder bonding portion.

In one preferred aspect of the invention, in step (4), the base material is sufficiently cured by maintaining the heating temperature for a predetermined time, generally at least 5 minutes, preferably 5 minutes to 15 minutes according to the thermosetting resin to be used, and then cooled to, for example, a room temperature. In the aspect, a ratio of an area occupied by the cured thermosetting resin portion on a main surface of the base material (that is, a contact area between the cured thermosetting resin portion and the base material, hereinafter, also simply referred to as a "thermosetting resin portion occupied area") to a sum of this area thereof and an area (that is, a contact area between the solder bonding portion and the base material, hereinafter, also referred to as a "solder bonding portion exclusive area") occupied by the solder bonding portion on the main surface of the resin base material is preferably 10% to 40%.

In a second aspect of the invention, there is provided the mounting structure in which the electronic component is mounted on the resin base material, the mounting structure including:
the resin base material; the wiring pattern formed of the conductive paste on the resin base material; the electronic component disposed on the base material; and the solder bonding portion electrically connecting the wiring pattern and the electronic component, more specifically, the electrode thereof, in which
the cured thermosetting resin portion is interposed between the solder bonding portion and the resin base material.

This mounting structure can be obtained by the above-described mounting method of the invention. In one preferred aspect of the invention, as described above, a ratio of a thermosetting resin portion area (a) to a sum (a+b) of the thermosetting resin portion exclusive area (a) and a solder bonding portion exclusive area (b) (that is, a/(a+b)) is 0.1 to 0.4 (that is, 10% to 40%).

According to the method for mounting the electronic component of the invention and the mounting structure of the invention, when the electronic component is soldered to the wiring pattern formed of the conductive paste, the bonding strength between the wiring pattern and the base material is reinforced by interposing the cured thermosetting resin portion in a part between the solder bonding portion and the resin base material.

More specifically, the cured thermosetting resin portion interposed between the base material and the solder bonding portion, which is generated by the heating of the solder paste, adheres to the solder bonding portion generated by the melting of the solder particles at the time of curing to improve adhesiveness therebetween, and also adheres to the resin base material, so that the adhesiveness between the resin base material and the cured thermosetting resin portion is also improved in the formed mounting structure. The cured thermosetting resin portion interposed in this manner adheres to the base material and also adheres to the solder bonding portion. In other words, the cured thermosetting resin portion is interposed between the solder bonding portion connecting the wiring pattern and the electronic component and the base material to improve the adhesiveness therebetween. As a result, since the solder bonding portion more firmly adheres to the base material, the wiring pattern and/or the electronic component adhering to the solder bonding portion also more firmly adheres to the base material, that is, the adhesiveness therebetween is reinforced.

Hereinafter, embodiments of the invention will be described with reference to the drawings, but the invention is not limited to the embodiments.

Figure 1:
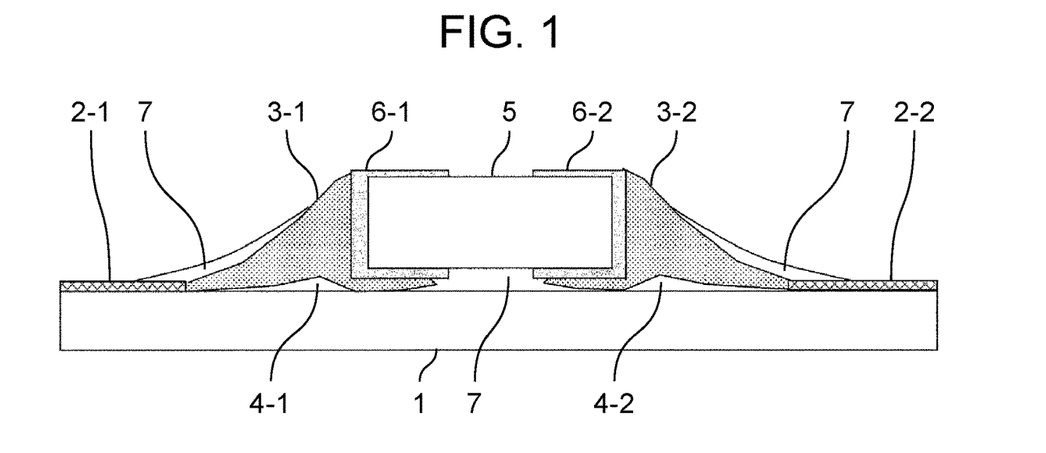
FIG. 1 is a schematic cross-sectional view of a part of a mounting structure of the invention obtained by a mounting method of the invention.

FIG. 1 is a schematic cross-sectional view of a part of the mounting structure in which electronic component 5 is mounted on resin base material 1 by the mounting method of the invention in a direction perpendicular to a main surface of the base material. In FIG. 1, the part of the mounting structure is shown in an enlarged manner in order to make details of the mounting structure clearer. The mounting structure includes wiring patterns 2-1 and 2-2 formed of the conductive paste on one main surface of resin base material 1. Solder bonding portions 3-1 and 3-2 electrically connect electrodes 6-1 and 6-2 of the electronic component to wiring patterns 2-1 and 2-2 formed of the conductive paste, respectively. Further, cured thermosetting resin portions 4-1 and 4-2 are interposed between solder bonding portions 3-1 and 3-2 and resin base material 1. In the shown aspect, cured thermosetting resin portions 7 are also present on an outer side of each of solder bonding portions 3-1 and 3-2 and on a lower side of the electronic component.

Figure 2:
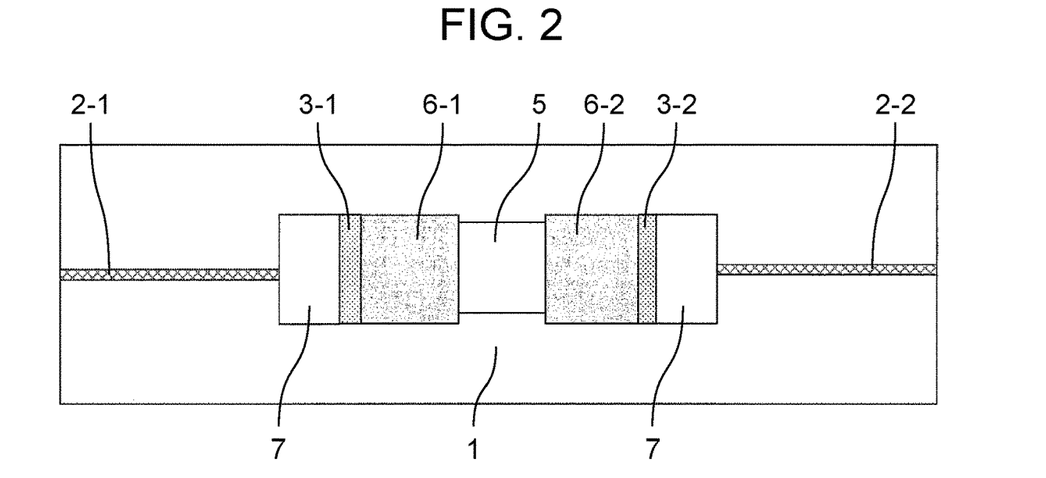
FIG. 2 is a view (corresponding to a plan view) schematically showing a state in which a part of the mounting structure of FIG. 1 is viewed from above.

FIG. 2 is a view schematically showing a state in which the mounting structure shown in FIG. 1 is viewed from above in FIG. 1, that is, a schematic plan view of the mounting structure shown in FIG. 1. As can be seen from FIGS. 1 and 2, wiring 2-1 as the wiring pattern is connected to electrode 6-1 of electronic component 5, and wiring 2-2 as the wiring pattern is connected to electrode 6-2 of electronic component 5. As can be easily understood, when the mounting structure is formed, the solder paste is usually supplied to the upper main surface of base material 1 such that solder bonding portions 3-1 and 3-2 formed by heating are formed from end portions of wirings 2-1 and 2-2 to electrodes 6-1 and 6-2 to be connected.

In one aspect, the solder paste is supplied so as to cover the end portions of wirings 2-1 and 2-2 and a base material portion around the end portions, cover a base material portion located below electrodes 6-1 and 6-2, and further cover the main surface portion of the base material located between electrodes 6-1 and 6-2. In another aspect, the solder paste is supplied to the base material so as to further cover a peripheral portion of the portions to be covered. As described above, the predetermined resin base material to which the solder paste is supplied is selected such that the solder bonding portion formed by heating the supplied solder paste can ensure electrical connection between the wiring pattern and the electronic component, particularly, the electrode thereof. A position to which the solder paste is supplied in this manner is a predetermined position of the resin base material in the invention.

In the shown aspect, solder bonding portions 3-1 and 3-2 are formed to extend from upper sides of the base material portions positioned below electrodes 6-1 and 6-2 of the electronic component to an outer side and to the end portions of wirings 2-1 and 2-2. For example, by supplying the solder paste between the end portion of wiring 2-1 and a left end of a position at which electronic component 5 is to be disposed, solder bonding portion 3-1 in which the melted solder particles electrically connect the end portion of wiring 2-1 and electrode 6-1 can be formed.

Figure 3:
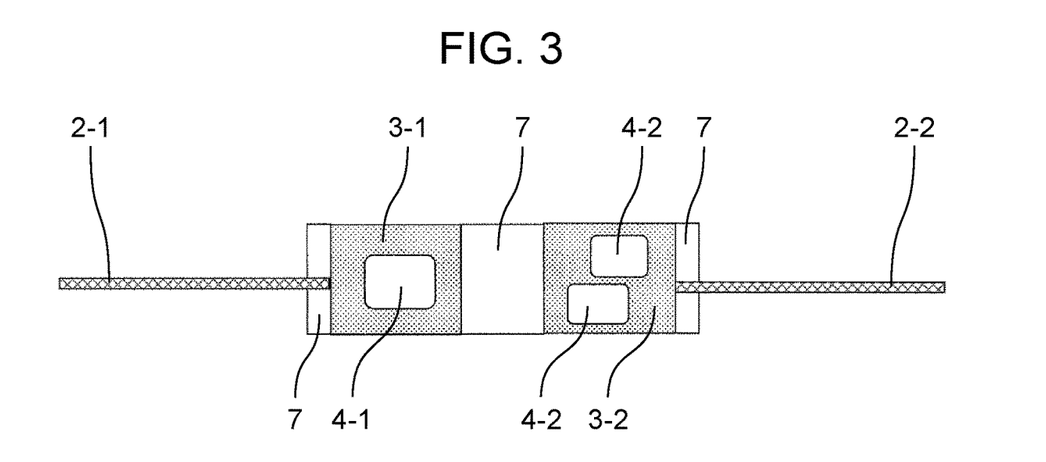
FIG. 3 is view (corresponding to a bottom view, and a base material is omitted) schematically showing a state in which a part of the mounting structure of FIG. 1 is viewed from below.

FIG. 3 schematically shows a state when the mounting structure of FIG. 1 is viewed from below (however, the base material 1 is omitted). That is, FIG. 3 is a bottom view of the mounting structure. As shown in FIG. 3, cured thermosetting resin portion 4-1 is present inside solder bonding portion 3-1. Further, there are cured thermosetting resin portions 4-2 at two positions inside solder bonding portion 3-2.

In the mounting method of the invention, when the solder paste is heated to a temperature of 105° C. to 130° C., preferably 110° C. to 125° C., for example, 120° C. to melt the solder particles, an uncured thermosetting resin becomes liquid and flows in a case of being solid, and in a case of already being liquid, the thermosetting resin further increases in fluidity, gradually starts curing, and cured thermosetting resin portion 4 is formed. In a preferred aspect, in addition to cured thermosetting resin portion 4, cured thermosetting resin portions 7 are also formed on an outer side (that is, an upper side) of solder bonding portion 3 and/or the lower side of the electronic component. As described above, in order to form such cured thermosetting resin portion 4, it is preferable to maintain the heating temperature for at least 5 minutes, preferably 5 minutes to 15 minutes.

In a particularly preferred aspect, the ratio (a/(a+b)) of the thermosetting resin portion occupied area (for example, a contact area (a) between thermosetting resin portion 4-1 and base material 1) to the sum (a+b) of the area and the solder bonding portion exclusive area (for example, a contact area (b) between solder bonding portion 3-1 and base material 1) is 10% to 40%. Regarding this ratio, the thermosetting resin portion to be considered is only thermosetting resin portion 4 located below solder bonding portion 3, and is not thermosetting resin portion 7 located directly below electronic component 5. The thermosetting resin portion occupied area and the solder bonding portion exclusive area can be measured by observing the resin base material from a back surface if the resin base material is transparent. When the resin base material is not transparent, the areas can be measured by X-ray observation or by removing the resin base material by polishing and the like to expose a bottom surface of the solder bonding portion.

Hereinafter, the invention will be described in more detail by specifically describing various materials and the like used for forming the mounting structure of the invention described above.

Electronic Component

In the present specification, electronic component 5 is not particularly limited, and is a component which should to ensure the electrical connection with the wiring pattern formed on the base material by being mounted on base material 1. Specifically, the electronic component may be a component for surface mount technology (SMT). Examples of the electronic component include active elements such as an IC chip, a communication component, and a sensor component, and passive elements such as a resistor, a capacitor, and an inductor. Such an electronic component has an electrode formed of a metal (for example, Sn, Au, Ag, and Cu) which can be soldered to the wiring pattern.

Resin Base Material

In the present specification, as the resin base material, a thermoplastic resin or a thermosetting resin can be used depending on an application. As the thermoplastic resin, various resins such as polyimide (PI), polycarbonate (PC), polyethylene terephthalate (PET), polyethylene naphthalate (PEN), urethane-based, olefin-based, styrene-based, and amide-based elastomers can be used. As the thermosetting resin, various resins such as epoxy, urethane, silicone, and an acrylic resin can be used. As a material of the base material, a stretchable material such as an elastomer may be used when stretchability is required. From a viewpoint of cost of the base material, the thermoplastic resin is generally suitable.

Conductive Paste

A conductive paste generally used for forming a wiring pattern on a base material can be used. The conductive paste is supplied to a predetermined position of the base material by screen printing, coating, and the like, and heated and dried to form a wiring pattern. Here, the wiring pattern means a wiring and/or an electrode necessary for forming a predetermined circuit together with an electronic component. Such a wiring pattern includes, for example, a metal powder of Ag, Cu, Sn, Ni, Au, and the like and a metal powder of a combination thereof as conductive particles. When the wiring pattern is desired to have stretchability and flexibility, the wiring pattern may contain a binder resin. An urethane-based resin, a silicone-based resin, an epoxy-based resin, an acrylic-based resin, a polyester-based resin, and the like can be used as the binder resin.

Solder Paste

A solder paste in the present embodiment includes solder particles and a thermosetting resin (including a curing agent necessary for curing), and may further include an active agent component and other components as necessary. When such a solder paste is heated to a temperature of 105° C. to 130° C., the solder particles are melted to form a solder bonding portion, and a cured thermosetting resin portion is interposed between the solder bonding portion and a base material. Next, components of the solder paste will be described in detail.

Solder Particles

The solder particles are substantially formed of an alloy having a melting temperature of 90° C. to 130° C., preferably 90° C. to 110° C., and more preferably 90° C. to 100° C., and are melted by heating the solder paste in step (4) of the mounting method of the invention. Examples of such an alloy include an alloy containing Sn or Bi as an essential component, and an alloy containing at least one of Ag, In, Pb, Sb, Cd, and Ga, for example, In as a constituent component in addition to Sn or Bi. More specifically, examples thereof include those selected from a group including Sn-In based, Bi-In based, Sn-Bi-In based, Sn-Bi-Pb based, Sn-Bi-Cd based, Sn-Ag-Bi-In based, and Sn-Ag-In based alloys. As long as the solder particles are substantially formed of the elements listed above, the solder particles may contain a trace metal which is inevitably mixed, for example, Ni, Zn, Sb, and Cu.

The melting temperature of the solder particles means a temperature at which it is understood that the solder particles start melting when a state change of a sample of the solder particles in a heating and temperature rising process is observed, and can be measured using a differential scanning calorimeter (DSC), TG-DTA, and the like in the present specification.

An average particle diameter of the solder particles is, for example, within a range of 10 μm to 35 μm, particularly within a range of 15 μm to 30 μm, and more particularly within a range of 20 μm to 25 μm. In the present specification, the average particle diameter is a particle diameter (D50) at a point where a cumulative value is 50% in a cumulative curve in which a particle size distribution is obtained on a volume basis and a total volume is 100%. The average particle diameter can be measured using a laser diffraction/scattering particle diameter/particle size distribution measurement device or an electron scanning microscope.

In the invention, a content amount of the solder particles with respect to a total mass of the solder paste is within a range of 40 mass % to 95 mass %, more preferably 50 mass % to 90 mass %, and still more preferably 60 mass % to 82 mass %. When the content amount is in such a range, high connection reliability of the bonding portion can be implemented.

Thermosetting Resin

In the invention, a thermosetting resin refers to a resin which has a predetermined functional group in a structure thereof and can be cured by heating. Examples thereof include, but are not limited to, an epoxy resin, a urethane resin, an acrylic resin, a polyimide resin, a polyamide resin, bismaleimide, a phenol resin, a polyester resin, a silicone resin, and an oxetane resin. These may be used alone or in combination of two or more. Among these, in view of improving physical properties of a cured product of the solder paste, it is preferable to use the epoxy resin. More preferably, the epoxy resin is liquid at a room temperature such that other components such as the solder particles can be easily dispersed. Examples of the epoxy resin include a bisphenol A type epoxy resin, a bisphenol F type epoxy resin, a bisphenol S type epoxy resin, a glycidylamine type resin, an alicyclic epoxy resin, an aminopropane type epoxy resin, a biphenyl type epoxy resin, a naphthalene type epoxy resin, an anthracene type epoxy resin, a triazine type epoxy resin, a dicyclopentadiene type epoxy resin, a triphenylmethane type epoxy resin, a fluorene type epoxy resin, a phenol aralkyl type epoxy resin, and a novolac type epoxy resin.

In the invention, the type and the content amount of the thermosetting resin contained in the solder paste can be appropriately selected and adjusted such that the peak temperature (that is, a peak temperature of the curing exothermic reaction) as a result of heat generation by a curing reaction of the thermosetting resin is 135° C. to 165° C., preferably 140° C. to 160° C., according to the type and the content amount of the alloy of the solder particles, a type and a content amount of the curing agent to be described later contained in the paste, and elements such as other additives and a content amount thereof.

The peak temperature means a temperature measured as a peak temperature (so-called peak top temperature) obtained when an uncured thermosetting resin is heated by rising the temperature using the DSC. Further, when the solder paste contains the curing agent and various other components to be described later in addition to the thermosetting resin, these components are also heated together and measured. In the present specification, the peak temperature measured in this case is also referred to as the peak temperature of the curing exothermic reaction. In a preferred aspect, the peak temperature of the curing exothermic reaction is at least 10° C., more preferably at least 20° C. higher than the melting temperature of the solder particles, for example, 15° C. to 25° C. higher.

Curing Agent

In the solder paste used in the invention, as a curing agent, a general curing agent can be used depending on a thermosetting resin to be used. For example, a compound selected from a group including an imidazole-based compound, a thiol-based compound, a modified amine-based compound, a polyfunctional phenol-based compound, and an acid anhydride-based compound can be used.

The type and the content amount of the curing agent contained in the solder paste used in the invention can be appropriately selected and adjusted such that the curing exothermic reaction of the thermosetting resin starts in step (4) of the mounting method of the invention and the peak temperature of the curing exothermic reaction of the thermosetting resin falls within a predetermined temperature range as described above, according to an alloy composition and a content amount thereof of the solder particles contained in the solder paste, the above-described thermosetting resin and the content amount thereof, and various other components (if necessary) and a content amount thereof to be described later. Further, the content amount of the curing agent can be appropriately adjusted according to a functional group equivalent of the thermosetting resin based on the related art.

Active Agent Component

The active agent component in the solder paste used in the invention may be any appropriate component as long as it has a function of removing a metal oxide film, and a type thereof is not limited. For example, in a temperature range in which the solder paste is heated, an organic acid, a halogen salt of amine, and an amine organic acid salt having a reducing power for removing an oxide film which may be present on an electrode, a wiring (more specifically, conductive particles to be described later), and/or a surface of a solder particle of an electronic component which is a member to be bonded may be used. Examples of the organic acid include lauric acid which is a saturated aliphatic monocarboxylic acid, myristic acid, palmitic acid or stearic acid, levulinic acid, crotonic acid which is an unsaturated aliphatic monocarboxylic acid, oxalic acid which is a saturated aliphatic dicarboxylic acid, L(-)-malic acid, malonic acid, succinic acid, glutaric acid, adipic acid, pimelic acid, suberic acid, azelaic acid or sebacic acid, maleic acid or fumaric acid which is an unsaturated aliphatic dicarboxylic acid, phthalaldehyde acid which is an aromatic carboxylic acid, phenylbutyric acid, phenoxyacetic acid or phenylpropionic acid, diglycolic acid which is an ether-based dicarboxylic acid, abietic acid which is another organic acid, and ascorbic acid. When these components, particularly preferably the organic acid are contained in the solder paste, an excellent flux action, that is, a reduction function of removing an oxide film formed on a metal surface to which the solder paste is applied, and a function of reducing a surface tension of the molten solder to promote wettability of the solder to a bonding metal surface can be exhibited. Among the organic acids, glutaric acid or adipic acid is more preferable because it has excellent flux action and high stability as a compound. The content amount of the active agent component can be appropriately adjusted according to the functional group equivalent of the thermosetting resin based on the related art.

Other Components

A solder paste used in the invention may further contain other components such as a modifier or an additive as necessary. For example, in order to maintain a printed shape of the solder paste on a wiring, an inorganic or organic additive can be used as a viscosity modifier or a thixotropy-imparting agent. For example, in a case of the inorganic additive, silica, alumina, and the like can be used. In a case of the organic additive, a solid epoxy resin, a low molecular weight amide, a polyester, an organic derivative of castor oil, and the like can be used. These may be used alone or in combination of two or more.

Further, the solder paste used in the invention may contain a curing accelerator in addition to the curing agent. Examples of the curing accelerator include tertiary amines, cyclic amines such as 1,8-cliazabicyclo (5.4.0) undecene-7 and 1,5-diazabicyclo (4.3.0) nonene-5, tetraphenylborate salts thereof, trialkylphosphines such as tributylphosphine, triarylphosphines such as triphenylphosphine, quaternary phosphonium salts such as tetraphenylphosphonium tetraphenylborate and tetra (n-butyl) phosphonium tetraphenylborate, metal complexes such as Fe acetylacetonate, and adduct compounds thereof.

In one aspect, when the solder particles have a Sn-Bi-In based alloy composition, the epoxy resin is used as the thermosetting resin, and the imidazole-based compound is used as the curing agent, connection reliability of the solder bonding portion can be reinforced by setting the content amount of the thermosetting resin with respect to the total mass of the solder paste within a range of, for example, 5 mass % to 30 mass %, particularly 10 mass % to 25 mass %, and more particularly 12 mass % to 20 mass %.

Such a solder paste is supplied to a predetermined position of the base material having the wiring pattern by, for example, a method similar to a method of supplying the conductive paste. The predetermined position is appropriately selected such that the bonding portion formed of the solder paste provides intended electrical connection between the electrode of the electronic component and the wiring pattern formed on the base material. For example, the predetermined position may be, for example, on the wiring and/or the electrode, on and around the wiring and/or the electrode, between the wiring and the wiring, and an appropriate combination thereof.

Next, an example of a specific method for forming the mounting structure of the invention will be described. As resin base material 1, the PET having a thickness of 0.1 mm is used. Wiring pattern 2 formed of the conductive paste is formed by drawing the conductive paste (product number: CI-1036, manufactured by EMS Corporation) containing Ag-based conductive particles as a main component of connection on the base material by screen printing, and then drying the conductive paste at 120° C. for 15 minutes. A thickness of an Ag wiring pattern after the drying is, for example, 10 to 20 μm.

Thereafter, particles of a solder alloy (for example, a 25Sn-55Bi-20In alloy having a melting point of 98° C.) formed of Sn, Bi, and In and having a melting temperature of 98° C., and a solder paste (a peak temperature of a curing exothermic reaction of a thermosetting resin: for example, 143° C.) mainly containing an epoxy resin as a thermosetting resin, carboxylic acid, and a curing agent are supplied to the base material position where electrode 6 of electronic component 5 to be bonded is located by the screen printing using a metal mask having a thickness of 0.1 mm. Thereafter, electronic component 5 is placed at a predetermined position, the temperature of the base material is raised to 130° C. using a reflow furnace and maintained for 10 minutes, and wiring pattern 2 formed of the conductive paste and electrode 6 of the electronic component are metal-bonded.

During heating in such a reflow furnace, when the melted solder wets and spreads on the wiring pattern formed of the conductive paste containing the Ag-based conductive particles as the main component of connection, Ag contained in the conductive paste diffuses into the melted solder. The epoxy resin contained in the solder paste and in a fluidized state enters a portion where Ag is originally present when Ag diffuses into the solder and is cured, and as a result, thermosetting resin portion 4 interposed between solder bonding portion 3 and resin base material 1 is formed. When the peak temperature of the curing exothermic reaction of the epoxy resin is in a range of 135° C. to 165° C., since the viscosity of the epoxy resin is still sufficiently low when the epoxy resin enters in this manner, the epoxy resin easily enters the portion where Ag is present.

In general, the area of the thermosetting resin portion increases as a temperature of the reflow furnace increases and as a heating time increases. Further, the thermosetting resin portion occupied area varies depending on the type and the thickness of the formed wiring pattern. In general, when the mounting structure is formed by the mounting method of the invention, the thermosetting resin portion occupied area is preferably 10 to 40% of the sum of this area and the solder bonding portion exclusive area, and the adhesiveness by the thermosetting resin is reinforced.

Examples and Comparative Examples

A wiring pattern was formed with a conductive paste (product number: CI-1036, manufactured by EMS Corporation) on a resin base material made of a PET resin having a thickness of 0.1 mm. Next, a solder paste was supplied onto the formed wiring pattern using a metal mask.

Compositions of the solder pastes used in Example 1, Example 2, Example 4, and Comparative Example 1 were as follows:

Solder particles (average particle size: 20 to 30 μm, 25Sn-55Bi-20In alloy): 80 mass %

Epoxy resin (manufactured by Mitsubishi Chemical Corporation, trade name: 806): 16 mass %

Levulinic acid: 2.5 mass %

Imidazole-based curing agent (manufactured by Shikoku Chemicals Corporation, trade name: 2P4MHZ): 1.5 mass %

A peak temperature of a curing exothermic reaction of the epoxy resin containing carboxylic acid and a curing agent was measured by the DSC and found to be 143° C.

A solder paste used in Example 3 was obtained by changing the imidazole-based curing agent in the composition of the solder paste to an imidazole-based curing agent having a trade name of 2MZ-A 1.5 mass % manufactured by Shikoku Chemicals Corporation. Similarly, the peak temperature of the curing exothermic reaction of the epoxy resin used in the solder paste was measured by the DSC and found to be 155° C.

A solder paste used in Comparative Example 2 and Comparative Example 3 was obtained by changing the imidazole-based curing agent in the composition of the solder paste to an imidazole-based curing agent having a trade name of 2E4MZ-A 1.5 mass % manufactured by Shikoku Chemicals Corporation. Similarly, the peak temperature of the curing exothermic reaction of the epoxy resin used in the solder paste was measured by the DSC and found to be 120° C.

Next, after a chip capacitor of 2125 size as an electronic component was placed on the supplied solder paste, the base material was placed in a reflow furnace and heated at a predetermined heating temperature for a predetermined time to form a bonding portion between the chip capacitor and the wiring.

A thermosetting resin portion occupied area ratio of the formed bonding portion was measured, and a bonding strength thereof was determined. Results are shown in Table 1 of FIG. 4.

Regarding the area ratio, the bonding portion was observed from a back surface of a transparent base material, the area of the thermosetting resin portion and a bonding portion exclusive area were measured, and as described above, a ratio of the thermosetting resin portion occupied area to a sum of this area and the solder bonding portion exclusive area was defined as a "thermosetting resin portion occupied area ratio".

Further, regarding determination of the bonding strength, the bonding strength at the bonding portion was evaluated by measuring a shear strength at a speed of 1 mm/s using a share tester (PTR-1100, manufactured by RHESCA Corporation), and in a case where an average bonding strength was 4000 gf or more when number of samples is 10 or more, the bonding strength was determined as "appropriate", and when the average bonding strength was smaller than 4000 gf, the bonding strength was determined as "inappropriate".

Figure 4:
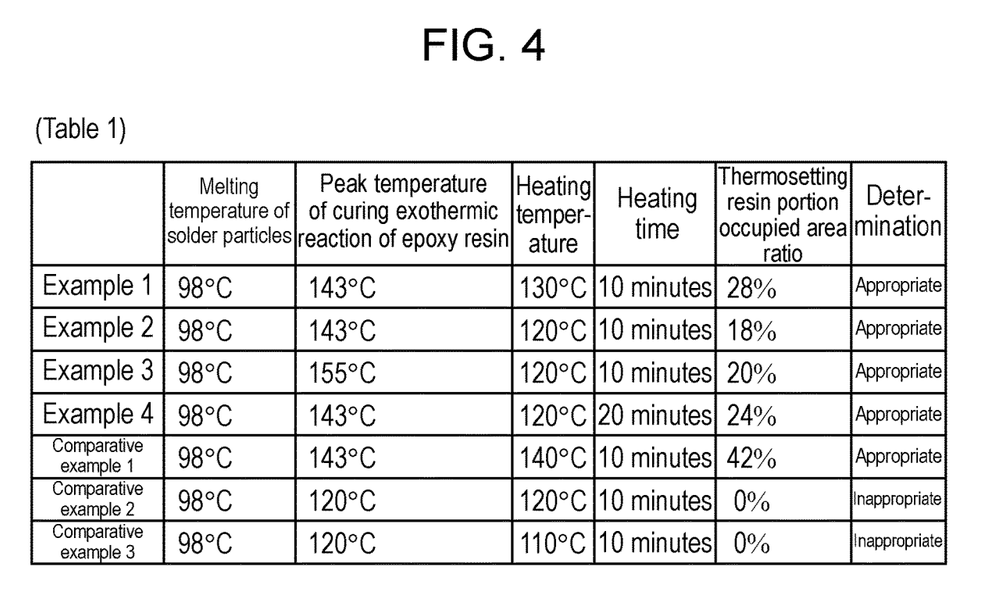
FIG. 4 is a diagram showing measurement results of a thermosetting resin portion occupied area ratio of the mounting structure and evaluation results of a bonding strength.

As can be seen from the results in Table 1, when there is no reinforcement of the thermosetting resin and the like, the bonding strength of the wiring pattern to the resin base material substantially depends on a bulk strength of the wiring pattern, and in general, the bulk strength of the wiring pattern was not sufficient in many cases, and it was determined as "inappropriate" in Comparative Example 2 and Comparative Example 3. On the other hand, when the thermosetting resin portion occupied area is 10% or more, the wiring pattern and the solder bonding portion are firmly fixed to the base material by the thermosetting resin portion, and an electronic component and the solder bonding portion are firmly fixed to the base material by the thermosetting resin portion. Thus, as can be seen from the results of Examples 1 to 4, the solder bonding portion having mechanically high reliability is obtained. Solder bonding portion 3 has an alloy composition in which a metal (for example, Ag) constituting conductive particles of the wiring pattern is diffused. When the thermosetting resin portion occupied area is 40% or more, since a problem may occur that the bonding strength between the wiring pattern and the solder bonding portion becomes insufficient and disconnection is likely to occur, such a ratio is not generally preferable.

In a particularly preferred aspect, an outer side of solder bonding portion 3 and/or a lower side of electronic component 5 is covered with thermosetting resin portion 7 which is cured by being separated from the solder paste. As described above, according to the invention, a mounting structure having high mechanical reliability can be obtained by reinforcement by thermosetting resin portion 7 in contact with thermosetting resin portion 4 interposed between the solder bonding portion and the resin base material and an outer periphery of solder bonding portion 3 formed by being separated from the solder paste, and/ or thermosetting resin portion 7 formed between electronic component 5 and base material 1.

In a mounting structure formed by a mounting method of the invention, adhesiveness between a base material and a solder bonding portion is reinforced, and as a result, adhesiveness between a wiring pattern and an electronic component is reinforced. Therefore, such a mounting structure can be effectively used for a flexible electronic device such as a wearable device which is used by being attached to clothes or skin.

What is claimed is:

1. A mounting method for mounting an electronic component on a resin base material, the method comprising:
    (1) preparing the resin base material having a wiring pattern formed of a conductive paste;
    (2) supplying a solder paste which contains solder particles and a thermosetting resin in a state before curing to a predetermined portion of the resin base material;
    (3) placing the electronic component on the solder paste; and
    (4) heating the resin base material to heat the solder paste to a temperature in a range from 110° C. to 125° C., inclusive to melt the solder particles, and starting a curing exothermic reaction of the thermosetting resin, wherein
    the thermosetting resin in the state before curing includes an epoxy resin, a carboxylic acid, and an imidazole-based curing agent, and
    a melting temperature of the solder particles is in a range from 90° C. to 125° C., inclusive, and a peak temperature of the curing exothermic reaction of the thermosetting resin is in a range from 135° C. to 165° C., inclusive, wherein the peak temperature is a temperature obtained when an uncured thermosetting resin is heated by rising the temperature using the DSC.

2. The mounting method of claim 1, wherein
in step (4), a heating temperature is maintained for at least 5 minutes.

3. The mounting method of claim 1, wherein the solder paste further contains a curing accelerator.

4. The mounting method of claim 1, wherein the thermosetting resin is in an amount of 5-30 mass % with respect to total mass of the solder paste.

5. A mounting structure in which an electronic component is mounted on a resin base material, the mounting structure comprising:
   a resin base material; a wiring pattern formed of a conductive paste on the resin base material; an electronic component disposed on the resin base material; and a solder bonding portion electrically connecting the wiring pattern and the electronic component, wherein
   a cured thermosetting resin portion is interposed between the solder bonding portion and the resin base material,
   wherein an area of the portion where the solder bonding portion contacts the resin base material is A, an area of the region where the cured thermosetting resin portion interposed between the solder bonding portion and the resin base material contacts the resin base material is B, and the ratio of B/(A+B) is 10-40%.

6. The mounting structure of claim 5, wherein
   the mounting structure is formed by a mounting method for mounting an electronic component on a resin base material, the method comprising:
   (1) preparing the resin base material having a wiring pattern formed of a conductive paste;
   (2) supplying a solder paste which contains solder particles and a thermosetting resin in a state before curing to a predetermined portion of the resin base material;
   (3) placing the electronic component on the solder paste; and
   (4) heating the resin base material to heat the solder paste to a temperature in a range from 105° C. to 130° C., inclusive to melt the solder particles, and starting a curing exothermic reaction of the thermosetting resin, wherein
   a melting temperature of the solder particles is in a range from 90° C. to 130° C., inclusive, and a peak temperature of the curing exothermic reaction of the thermosetting resin is in a range from 135° C. to 165° C., inclusive, wherein the peak temperature is a temperature obtained when an uncured thermosetting resin is heated by rising the temperature using the DSC.

* * * * *